(12) United States Patent
Han et al.

(10) Patent No.: US 9,042,740 B2
(45) Date of Patent: May 26, 2015

(54) TRANSMITTER OPTICAL MODULE

(75) Inventors: Young-Tak Han, Daejeon (KR); Jang Uk Shin, Daejeon (KR); Sang Ho Park, Daejeon (KR); Oh Kee Kwon, Daejeon (KR); Dong-Hun Lee, Daejeon (KR); Yongsoon Baek, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 457 days.

(21) Appl. No.: 13/490,022

(22) Filed: Jun. 6, 2012

(65) Prior Publication Data

US 2013/0121702 A1   May 16, 2013

(30) Foreign Application Priority Data

Nov. 14, 2011  (KR) .................. 10-2011-0118089

(51) Int. Cl.
*H04B 10/04* (2006.01)
*H04B 10/12* (2006.01)
*H04B 10/50* (2013.01)
*G02B 6/42* (2006.01)
*H04B 1/04* (2006.01)

(52) U.S. Cl.
CPC ...... *G02B 6/4201* (2013.01); *H04B 2001/0408* (2013.01)

(58) Field of Classification Search
None
See application file for complete search history.

(56) References Cited

U.S. PATENT DOCUMENTS

2003/0174407 A1* 9/2003 Hammond .............. 359/642
2004/0243657 A1* 12/2004 Goren et al. ............ 708/607

OTHER PUBLICATIONS

Yasunori Miyazaki et al., "High-Power Ultralow-Chirp 10-Gb/s Electroabsorption Modulator Integrated Laser With Ultrashort Photocarrier Lifetime", IEEE Journal of Quantum Electronics, Apr. 2006, pp. 357-362, vol. 42, No. 4.
Jong-Ryeol Kim et al., "10Gbps High Power Electro-Absorption Modulated Laser Monolithically Integrated with a Semiconductor Optical Amplifier for Long-Distance Transmission", Japanese Journal of Applied Physics, Dec. 19, 2003, pp. L5-L7, vol. 43, No. 1A/B.

* cited by examiner

*Primary Examiner* — Darren E Wolf
(74) *Attorney, Agent, or Firm* — Rabin & Berdo, P.C.

(57) ABSTRACT

Disclosed is a transmitter optical module which includes a first package generating an optical signal; a second package bonded with the first package by using chip-to-chip bonding, having a silicon optical circuit platform structure, and amplifying the optical signal; and an optical waveguide forming a transmission path of the optical signal from the first package to the second package.

17 Claims, 4 Drawing Sheets

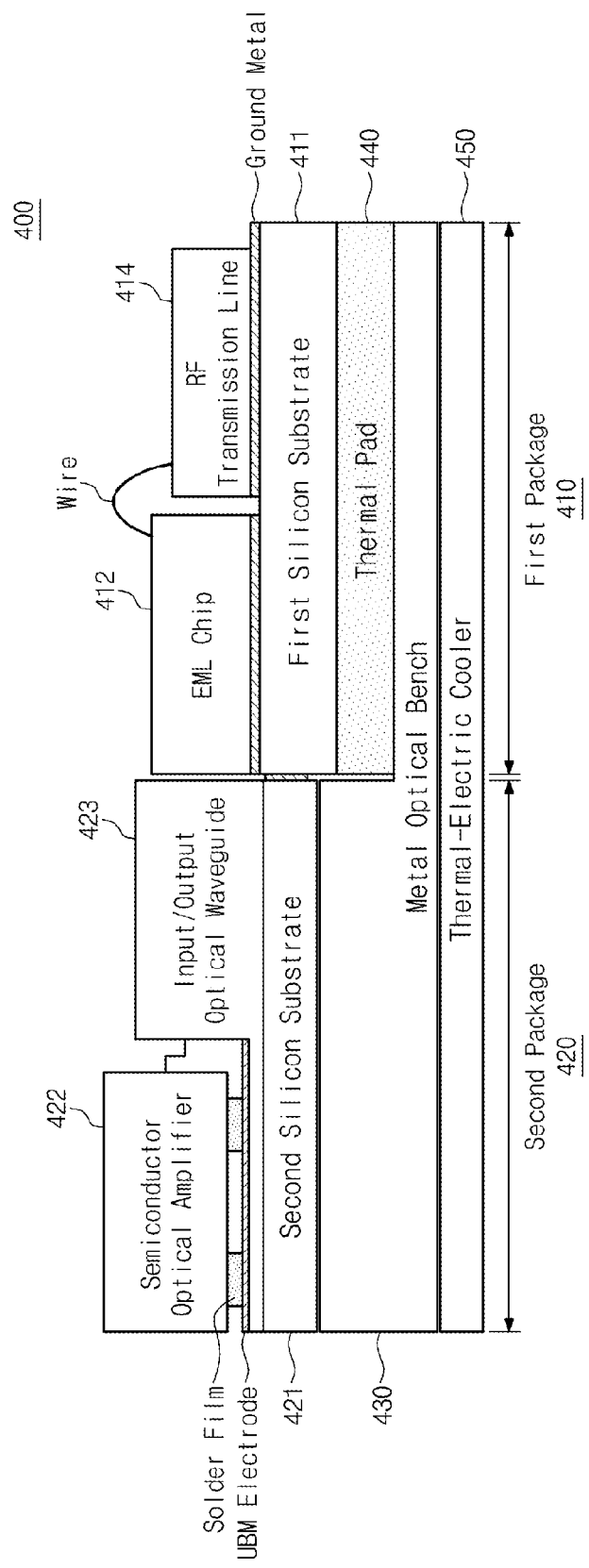

TRANSMITTER OPTICAL MODULE

CROSS-REFERENCE TO RELATED APPLICATIONS

A claim for priority under 35 U.S.C. §119 is made to Korean Patent Application No. 10-2011-0118089 filed Nov. 14, 2011, in the Korean Intellectual Property Office, the entire contents of which are hereby incorporated by reference.

BACKGROUND

The inventive concepts described herein relate to a transmitter optical module.

TDM-PON (time domain multiplexing passive optical network) system may be standardized as technology for providing service to subscribers using base station of the telephone company. With the TDM-PON system, plural subscribers may share one transmitter optical module to be provided with data from the telephone company. Efficiency of the TDM-PON system may be determined according to how many one transmitter optical module has a branching number using an optical splitter/combiner.

In the TDM-PON system, the amount of information transferred to subscriber may decrease according to increase in a branching number of the transmitter optical module. To overcome this drawback, the transmitter optical module must be configured to have high data rate and power. For example, the transmitter optical module of the TDM-PON system having more than 128 branches may require data rate of more than 10 Gbps and output power of more than 10 dBm.

Transmitter optical module with high-speed and high-power characteristics may be implemented by coupling optical output module and optical amplifier module. However, a size of transmitter optical module may increase when two modules are interconnected using an optical fiber outside each module, not assembled/connected in one package. Also, if functions for two modules are monolithically integrated, it is very difficult to optimize the optical output module and the optical amplifier module at the same time. Thus, the monolithic integration yield may be lowered.

SUMMARY

Example embodiments of the inventive concept provide a transmitter optical module which comprises a first package generating an optical signal; a second package coupled with the first package by chip-to-chip bonding, having a silicon planar lightwave circuit platform structure, and amplifying the optical signal; and an optical waveguide forming a transmission path of the optical signal from the first package to the second package.

In example embodiments, the first package comprises a first silicon substrate; an electro absorption modulated laser (EML) chip bonded on the first silicon substrate and outputting an optical signal; a monitor photo-diode bonded on the first silicon substrate and monitoring an optical signal output from the EML chip; a radio-frequency transmission line attached on the first silicon substrate and transferring a radio-frequency signal to the EML chip; and a matching resistor attached on the first silicon substrate and terminating the radio-frequency transmission line.

In example embodiments, the second package comprises a second silicon substrate; and a semiconductor optical amplifier amplifying an optical signal provided from the first package.

In example embodiments, the optical waveguide includes an input/output optical waveguide which is formed on the second silicon substrate and receives an optical signal from the EML chip.

In example embodiments, the input/output optical waveguide is formed to be inclined on a straight line with respect to the semiconductor optical amplifier.

In example embodiments, a spot-size converter is integrated to the input/output waveguide of the semiconductor optical amplifier to reduce a coupling loss between an input optical signal and that of the semiconductor optical amplifier.

In example embodiments, the transmitter optical module further comprises a lens collecting an optical signal output from the semiconductor optical amplifier; and an optical fiber ferrule receiving an optical signal collected through the lens, cross section being inclined by a predetermined angle.

In example embodiments, the second package further comprises a thermistor configured to detect heat generated from the semiconductor optical amplifier.

In example embodiments, the monitor photo-diode is disposed to be inclined on a straight line with respect to the EML chip.

In example embodiments, the radio-frequency transmission line is formed on a flexible printed circuit board in which a grounded coplanar waveguide electrode is used.

In example embodiments, the matching resistor is a surface mountable device type.

In example embodiments, a metal film forming an electric ground is deposited on the first silicon substrate, and the EML chip, the monitor photo-diode, the radio-frequency transmission line, and the matching resistor are disposed on the metal film.

In example embodiments, the EML chip is bonded on the metal film by a flip-chip bonding technique.

In example embodiments, the EML chip is bonded on the metal film in a die-bonding method.

In example embodiments, the EML chip comprises a light source outputting a continuous wave; and an electro absorption modulator (EAM) modulating the continuous wave into the optical signal. The optical waveguide includes an output waveguide outputting the optical signal modulated by the EAM to the outside of the first package. The output waveguide is formed to be inclined on a straight line of the EML and the EAM.

In example embodiments, the output waveguide has a spot-size converter to adjust a divergence angle of the modulated optical signal.

In example embodiments, the transmitter optical module further comprises a metal optical bench placed at lower parts of the first and second packages and attached on the lower part of the second package to dissipate heat generated by the second package; a thermal pad inserted between a lower part of the first package and an upper part of the metal optical bench to dissipate heat generated from the first package to the metal optical bench; and a thermal-electric cooler attached with a lower part of the metal optical bench to dissipate heat output from the metal optical bench to the outside.

In example embodiments, the first and second packages are bonded with ultraviolet epoxy.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 4 is a block diagram schematically illustrating a transmitter optical module according to still another embodiment of the inventive concept.

DETAILED DESCRIPTION

Figure 1:
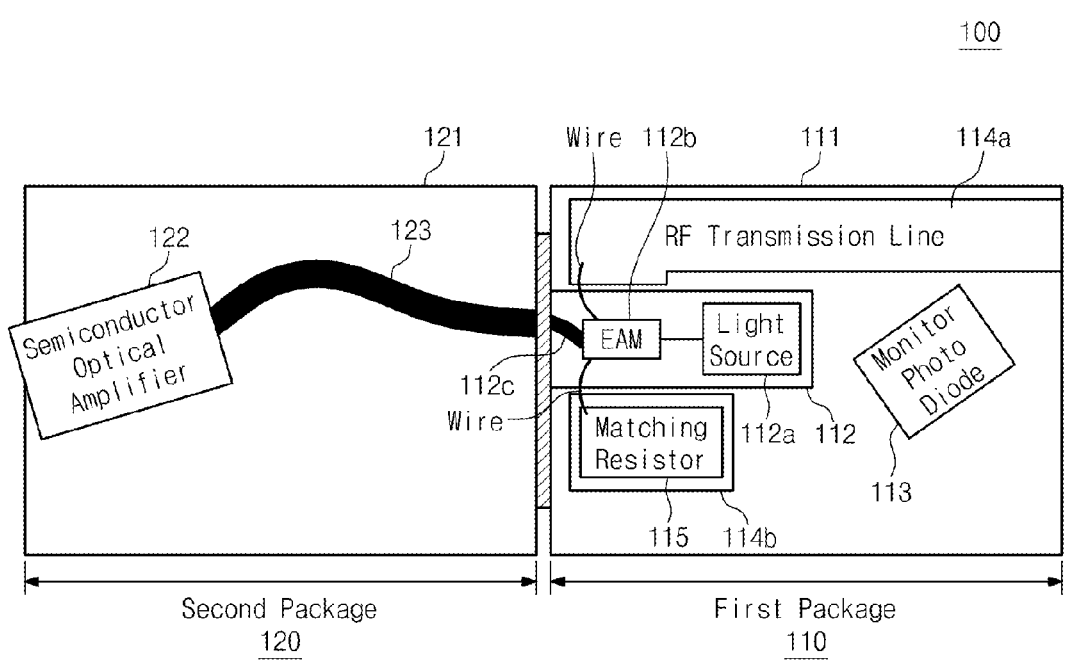
FIG. 1 is a block diagram schematically illustrating a transmitter optical module according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a transmitter optical module according to an embodiment of the inventive concept. Referring to FIG. 1, a transmitter optical module 100 may include a first package 110 and a second package 120.

The first package 110 may be an optical output module. The first package 110 may be fabricated to have a transmitter optical subassembly (TOSA) structure. The first package 110 may include a first silicon substrate 111, an electro absorption modulated laser (hereinafter, referred to as EML) chip 112, a monitor photo-diode 113, a radio-frequency (hereinafter, referred to as RF) transmission line 114, and a matching resistor 115.

The first silicon substrate 111 may have a thickness of about 1 mm. However, the inventive concept is not limited thereto. A metal functioning as an electric ground may be deposited on the first silicon substrate 111. The first silicon substrate 111 may have the large thermal conductivity. Thus, the first silicon substrate 111 may efficiently dissipate heat generated from the EML chip 112.

The EML chip 112 may be bonded on the metal on the first silicon substrate 111. Die-bonding may be performed between the EML chip 112 and the first silicon substrate 111 using silver epoxy or solder paste. Alternatively, flip-chip bonding may be performed between the EML chip 112 and the first silicon substrate 111 using AuSn solder. The EML chip 112 may be bonded on the first silicon substrate such that its p-side faces toward a top.

The EML chip 112 may include a light source 112a, an electro absorption modulator (hereinafter, referred to as EAM) 112b, and an output waveguide 112c.

The light source 112a may generate an optical signal. The optical signal generated from the light source 112a may be a continuous wave (CW). The light source 112a may be a distributed feedback laser diode (DFB-LD). The optical signal generated from the light source 112a may be modulated by the EAM 112b. The modulated optical signal may be transmitted to the output waveguide 112c.

The output waveguide 112c may output the input optical signal to the outside of the first package 110. The output waveguide 112c may be inclined with a predetermined angle, not aligned with the light source 112a and the EAM 112b. The output waveguide 112c may be coated with anti-reflection such that an output optical signal is reflected back to the light source 112a. In example embodiments, the output waveguide 112c may be inclined by about 7 degrees with respect to a straight line formed by the light source 112a and the EAM 112b. However, the inventive concept is not limited thereto.

The monitor photo-diode 113 may be bonded on the ground metal formed on the first silicon substrate 111. Die-bonding may be performed between the monitor photo-diode 113 and the first silicon substrate 111.

The monitor photo-diode 113 may be placed at the rear of the EML chip 112. The monitor photo-diode 113 may monitor an optical output signal of the EML chip 112. The monitor photo-diode 113 may be disposed to be inclined with respect to the EML chip 112. With this structure, upon receiving of an optical signal of the EML chip 112, the EML chip 122 may not be affected by the light reflected from a front facet of the monitor photo-diode 113

A first RF transmission line 114a may transfer an RF signal to the EML chip 112, and a second RF transmission line 114b may transfer the RF signal from the EML chip 112. The first RF transmission line 114a and the second RF transmission line 114b may be wire-bonded with the EML chip 112. The first RF transmission line 114a and the second RF transmission line 114b may be formed of a flexible printed circuit board (FPCB) where a grounded coplanar waveguide (GCPW) electrode is formed. The flexible printed circuit board (FPCB) may be cheaper than a ceramic sub-mount, and a fabrication process may be easy. Also, since the flexible printed circuit board (FPCB) may have the permittivity lower than the ceramic sub-mount, it may have good RF properties compared with the ceramic sub-mount.

The matching resistor 115 may terminate the second RF transmission line 114b as impedance of about 50 ohms. The matching resistor 115 may have a surface mountable device (SMD) type. The SMD-type matching resistor may be cheaper than a thin-film-type matching resistor, and a fabrication process may be easy. Die-bonding may be performed between the SMD-type matching resistor 115 and the RF transmission line 114 using silver epoxy or solder paste.

The second package 120 may be an optical amplifier module. The second package 120 may have a silica planar lightwave circuit platform structure. The second package 120 may include a second silicon substrate 121, a semiconductor optical amplifier (SOA) 122, and an input/output optical waveguide 123.

In example embodiments, the second silicon substrate 121 may have a thickness of about 1 mm. However, the inventive concept is not limited thereto. A trench for mounting the semiconductor optical amplifier 122 may be formed in the silica planar lightwave circuit platform on the second silicon substrate 121. An under bump metallurgy (UBM) electrode may be formed on the trench. The UBM electrode may be formed of a Cr/Ni/Au multi-layer film or a Ti/Pt/Au multi-layer film. A solder film may be formed on the UBM electrode. The solder film may be formed of AuSn. In example embodiments, a thickness of the solder film may be about 2 μm to 4 μm. However, the inventive concept is not limited thereto.

The semiconductor optical amplifier 122 may flip-chip bonded using the solder film and may be integrated in the trench. Optical coupling may be performed between one facet of the semiconductor optical amplifier 122 and the input/output optical waveguide 123. The semiconductor optical amplifier 122 may amplify an optical signal which is output from the EML chip 112 and is received through the input/output optical waveguide 123. The amplified optical signal may be output to the outside of the second package 120 from an opposite facet.

The input/output optical waveguide 123 may be a silica optical waveguide formed of a lower-clad, a core, and an upper-clad. The input/output optical waveguide 123 may be disposed to be inclined with respect to the semiconductor optical amplifier 122. In example embodiments, the input/output optical waveguide of the semiconductor optical amplifier 122 may be inclined by an angle of about 7 degrees with respect to a longitudinal axis of the semiconductor optical amplifier, and then the input/output optical waveguide 123 may be inclined by a certain angle with respect to the 7-degree to reduce optical back-reflection. With this structure, the input/output optical waveguide 123 may reduce an adverse effect caused by the reflection of asynchronous spontaneous emission (ASE) light of the semiconductor optical amplifier 122. A spot-size converter (SSC) may be formed at an input/output waveguide in the semiconductor optical amplifier 122 to reduce optical coupling loss between the input/output optical waveguide 123 and the input/output waveguide of the semiconductor optical amplifier 122. The spot-size converter (SSC) may adjust a divergence angle of an optical signal output from each waveguide.

Chip-to-chip bonding may be performed between the first package 110 and the second package 120 in an active optical alignment way. One lateral side of the first silicon substrate 111 of the first package 110 may be polished for coupling with the second package 120. Likewise, one lateral side of the second silicon substrate 121 of the second package 120 may be polished for coupling with the first package 110. The polished lateral sides of the first and second silicon substrates 111 and 121 may have a negligible surface roughness. Chip-to-chip bonding between the first package 110 and the second package 120 may be performed using ultraviolet epoxy. The twisting occurred in the chip-to-chip bonding may be reduced by using the ultraviolet epoxy with a small shrinkage.

Optical coupling may be performed between the output waveguide 112c of the first package 110 and the input/output optical waveguide 123 of the second package 120. A spot-size converter (SSC) may be formed at the output waveguide 112c to reduce optical coupling loss between two waveguides. The spot-size converter (SSC) may adjust a divergence angle of the light output from each waveguide. In example embodiments, a divergence angle of an optical output may be less than 18 degrees. Thus, optical coupling loss occurred between two waveguides may be reduced.

Since the transmitter optical module includes an optical output module and an optical amplifier module, it is possible to output a high-power optical signal. The modules may be packaged independently. Thus, compared with the case that the modules are integrated in one package, a process may be easy, and no narrow divergence angle of a device may be required. Since an optical signal is transferred between an EML chip and a semiconductor optical amplifier through an inclined optical waveguide, optical coupling loss may be reduced compared with the case that two devices are directly bonded. Optical coupling loss may be further reduced by forming a spot-size converter (SSC) at optical waveguides between two modules.

Figure 2:
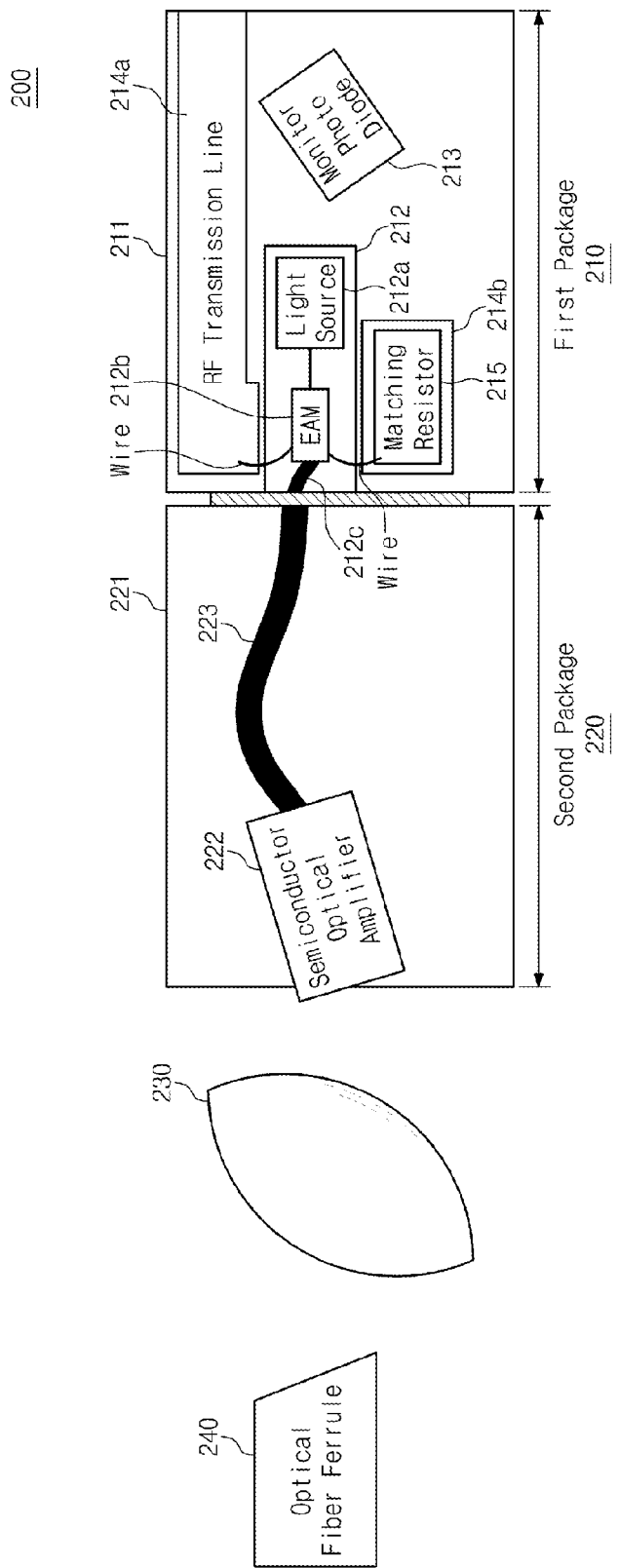
FIG. 2 is a block diagram schematically illustrating a transmitter optical module according to another embodiment of the inventive concept.

FIG. 2 is a block diagram schematically illustrating a transmitter optical module according to another embodiment of the inventive concept. A transmitter optical module in FIG. 2 may be equal to that in FIG. 1 except that a lens 230 and an optical fiber ferrule 240 are added. Thus, analogous elements may be marked by analogous reference numerals. Referring to FIG. 2, the transmitter optical module 200 may include a first package 210, a second package 220, a lens 230, and an optical fiber ferrule 240.

The lens 230 may be placed at a lateral side of the second package 220 opposite to the first package 210. The lens 230 may collect an optical signal output from a semiconductor optical amplifier 222 of the second package 220. The optical signal collected by the lens 230 may be coupled to the optical fiber ferrule 240.

That is, the optical fiber ferrule 240 may be optically coupled with a semiconductor optical amplifier through the lens 230. The optical fiber ferrule 240 may be polished to reduce optical coupling loss. A cross section of the optical fiber ferrule 240 may be inclined by a predetermined angle. In example embodiments, a cross section of the optical fiber ferrule 240 may be inclined by about 8 degrees. However, the inventive concept is not limited thereto.

With the transmitter optical module of the inventive concept, since an output optical signal is aligned with the optical fiber ferrule 240 using the lens 230, optical loss when an optical signal is output may be further reduced. Also, packaging using a lens may enable hermetic sealing in a structure where a silica planar lightwave circuit platform is used.

Figure 3:
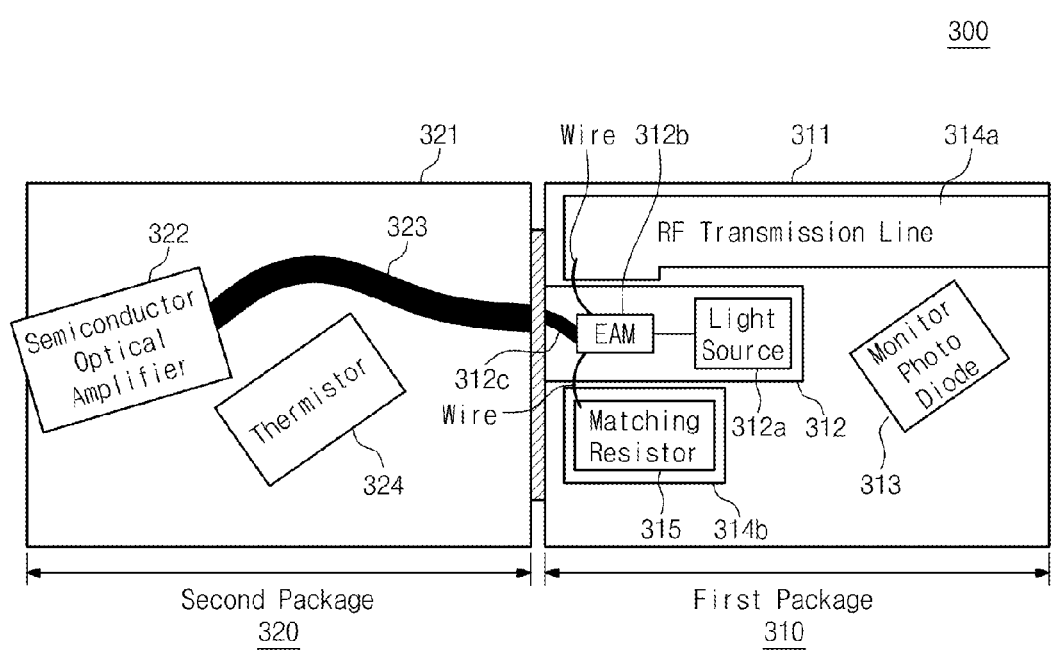
FIG. 3 is a block diagram schematically illustrating a transmitter optical module according to still another embodiment of the inventive concept.

FIG. 3 is a block diagram schematically illustrating a transmitter optical module according to still another embodiment of the inventive concept. A transmitter optical module 300 in FIG. 3 may be equal to that in FIG. 1 except that a thermistor 324 is added. Thus, analogous elements may be marked by analogous reference numerals.

Referring to FIG. 3, the transmitter optical module 300 may include a first package 310 and a second package 320. The second package 320 may include a second silicon substrate 321, a semiconductor optical amplifier 322, an input/output optical waveguide 323, and a thermistor 324.

The thermistor 324 may be bonded on the silica planar lightwave circuit platform formed on the second silicon substrate 321. The thermistor 324 may be die bonded on the second silicon substrate 321 using silver epoxy. The thermistor 324 may sense heat generated from the semiconductor optical amplifier 322.

The transmitter optical module may be configured to always sense heat of the second package using the thermistor 324. Thus, it is possible to instantly detect an abnormal operation due to overheating. Also, when a package temperature increases over a predetermined value, an operation of the transmitter optical module may be controlled according to a signal sensed from the thermistor 324.

FIG. 4 is a block diagram schematically illustrating a transmitter optical module according to still another embodiment of the inventive concept. A transmitter optical module 400 in FIG. 4 may be equal to that in FIG. 1 except that a metal optical bench (MOB) 430, a thermal pad 440, and a thermo-electric cooler (TEC) 450 are added. Thus, analogous elements may be marked by analogous reference numerals. A monitor photo-diode and a matching resistor are not illustrated in FIG. 4.

Referring to FIG. 4, the transmitter optical module 400 may include a first package 410, a second package 420, a metal optical bench (MOB) 430, a thermal pad 440, and a thermo-electric cooler (TEC) 450.

The second package 420 may be attached on the metal optical bench 430. The second package 420 may be attached on the metal optical bench 430 using silver epoxy. This may enable heat generated from a semiconductor optical amplifier 422 of the second package 420 to be dissipated to the metal optical bench 430.

The first package 410 may be attached on the thermal pad 440. The thermal pad 440 may be attached on the metal optical bench 430. That is, the thermal pad 440 may be inserted between the first package 410 and the metal optical bench 430. The thermal pad 440 may dissipate heat generated from the first package to the metal optical bench 430. In addition, the thermal pad 440 may reduce residual stress resulted from a difference between thermal expansion coefficient of the first package 410 and that of the second package 420 at a temperature cycling test. In the event that the first and second packages 410 and 420 are simultaneously attached on the metal optical bench 430 without insertion of the thermal pad 440, warping or twisting may be generated between the first and second packages 410 and 420 due to the thermal expansion. Thus, optical coupling loss may be generated.

The thermo-electric cooler 450 may be disposed at a lower part of the metal optical bench 430. The thermo-electric cooler 450 may dissipate heat, generated from the first and second packages 410 and 420 and dissipated to the metal optical bench 430, to the outside of the transmitter optical module 400.

The transmitter optical module 400 may dissipate heat to the outside using a thermal pad, a metal optical bench, and a thermo-electric cooler. Also, since optical coupling loss occurred during a temperature cycling test is reduced, an optical signal may be transmitted efficiently.

As described above, the transmitter optical module may operate a high speed as it has a high power.

For example, the transmitter optical module may be configured to form a spot-size converter at an optical waveguide between a first package and a second package, and thus optical output of the waveguide has a divergence angle of less than 18 degrees. In this case, optical coupling loss occurred between two packages may be less than 3 dB.

In the transmitter optical module of the inventive concept, a semiconductor optical amplifier may be flip-chip bonded on the silica planar lightwave circuit formed on a second silicon substrate. In this case, it is assumed that optical coupling loss owing to misalignment between the semiconductor optical amplifier and the silica optical waveguide is about 5 dB. In addition, it is assumed that optical coupling loss generated when output light of a second package is aligned with an optical fiber ferrule through a lens is about 2 dB.

In general, an optical signal output when an EML chip operates over 10 Gbps may be about 3 dBm. In this case, when a semiconductor optical amplifier with a saturation output of 13 dBm and a gain of 18 dB is used, an optical signal output to the optical fiber ferrule may be about 11 dBm.

Thus, the very compact transmitter optical module of the inventive concept may operate a high speed over 10 Gbps as it has a high power. Also, it is possible to provide a service to a subscriber efficiently by using the transmitter optical module. A process cost may be reduced by using a flexible printed circuit board (FPCB) and a SMD-type matching resistor.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A transmitter optical module comprising:
   a first package generating an optical signal;
   a second package assembled with the first package by chip-to-chip bonding, the second package having a silicon optical circuit platform structure and amplifying the optical signal; and an optical waveguide forming a transmission path of the optical signal from the first package to the second package;

wherein the first package includes:
a first silicon substrate;
an electro absorption modulated laser (EML) chip attached on the first silicon substrate and outputting an optical signal;
a monitor photo-diode attached on the first silicon substrate and monitoring the optical signal output from the EML chip;
a radio-frequency transmission line attached on the first silicon substrate and transmitting a radio-frequency signal to the EML chip; and
a matching resistor attached on the first silicon substrate and terminating the radio-frequency transmission line.

2. The transmitter optical module of claim 1, wherein the second package includes:
a silica planar lightwave circuit platform on a second silicon substrate; and
a semiconductor optical amplifier amplifying an optical signal provided from the first package.

3. The transmitter optical module of claim 2, wherein the optical waveguide includes an input/output optical waveguide that is formed on the second silicon substrate and receives an optical signal from the EML chip.

4. The transmitter optical module of claim 3, wherein the input/output optical waveguide is formed to be inclined on a straight line with respect to the semiconductor optical amplifier.

5. The transmitter optical module of claim 4, wherein the semiconductor optical amplifier has a spot-size converter to reduce a divergence angle of an input/output waveguide of the semiconductor optical amplifier.

6. The transmitter optical module of claim 2, further comprising:
a lens collecting an optical signal output from the semiconductor optical amplifier; and
an optical fiber ferrule receiving an optical signal collected through the lens, a cross section being inclined by a predetermined angle.

7. The transmitter optical module of claim 2, wherein the second package further includes a thermistor configured to detect heat generated from the semiconductor optical amplifier.

8. The transmitter optical module of claim 1, wherein the monitor photo-diode is disposed to be inclined on a straight line with respect to the EML chip.

9. The transmitter optical module of claim 1, wherein the radio-frequency transmission line is formed on a flexible printed circuit board in which a grounded coplanar waveguide electrode is formed.

10. The transmitter optical module of claim 1, wherein the matching resistor is a surface mountable device type.

11. The transmitter optical module of claim 1, wherein a metal film forming an electric ground is deposited on the first silicon substrate, and the EML chip, the monitor photo-diode, the radio-frequency transmission line, and the matching resistor are attached on the metal film.

12. The transmitter optical module of claim 11, wherein the EML chip is coupled with the metal film in a flip-chip bonding manner.

13. The transmitter optical module of claim 11, wherein the EML chip is integrated on the metal film using die-bonding method.

14. The transmitter optical module of claim 1, wherein the EML chip includes a light source outputting a continuous wave; and an electro absorption modulator (EAM) modulating the continuous wave into the optical signal;
wherein the optical waveguide includes an output waveguide outputting the optical signal modulated by the EAM to the outside of the first package; and
wherein the output waveguide is formed to be inclined on a straight line of the EML and the EAM.

15. The transmitter optical module of claim 14, wherein the output waveguide has a spot-size converter to adjust a divergence angle of the modulated optical signal.

16. The transmitter optical module of claim 2, further comprising:
a metal optical bench placed at lower parts of the first and second packages and attached on the lower part of the second package to dissipate heat generated from the second package to the outside;
a thermal pad inserted between a lower part of the first package and an upper part of the metal optical bench to dissipate heat generated from the first package to the metal optical bench; and
a thermal-electric cooler contacted on a lower part of the metal optical bench to dissipate heat output from the metal optical bench to the outside.

17. The transmitter optical module of claim 1, wherein the first and second packages are bonded using ultraviolet epoxy.

* * * * *